(12) United States Patent
Sidiropoulos et al.

(10) Patent No.: US 7,885,300 B1
(45) Date of Patent: Feb. 8, 2011

(54) METHODS AND CIRCUITS FOR DRIVING LARGE OFF-CHIP LOADS

(75) Inventors: Stefanos Sidiropoulos, Palo Alto, CA (US); Shwetabh Verma, Mountain View, CA (US); Shahriar Rabii, Palo Alto, CA (US)

(73) Assignee: NetLogic Microsystems, Inc, Santa Clara, CA (US)

( * ) Notice: Subject to any disclaimer, the term of this patent is extended or adjusted under 35 U.S.C. 154(b) by 316 days.

(21) Appl. No.: 11/367,253

(22) Filed: Mar. 2, 2006

Related U.S. Application Data

(60) Provisional application No. 60/658,468, filed on Mar. 4, 2005.

(51) Int. Cl.
*H01S 3/00* (2006.01)

(52) U.S. Cl. .................................... 372/38.02

(58) Field of Classification Search ............... 372/38.02
See application file for complete search history.

(56) References Cited

U.S. PATENT DOCUMENTS

2003/0138008 A1* 7/2003 Riaziat et al. .................. 372/36

OTHER PUBLICATIONS

Ransijn et al. "A 10-GB/s Laser/Modulator Driver IC With a Dual-Mode Actively Matched Output Buffer", Sep. 2001, IEEE, Journal of Solid-State Circuits, vol. 36, No. 9, 1314-1320.*
Cheskis et al., "GaAs Optoelectronic Integrated Circuits for Gigabit Ethernet", 1999, GAAS99, 1-4.*

* cited by examiner

*Primary Examiner*—Minsun Harvey
*Assistant Examiner*—Joshua King
(74) *Attorney, Agent, or Firm*—Stattler-Suh PC

(57) ABSTRACT

A method and system to drive large off-chip loads, such as, for example, laser diodes, wherein the system includes an integrated circuit coupled to an external differential diode load. Alternatively, the external diode load may be driven single-ended. The integrated circuit includes a data buffer device and a clock buffer device. The integrated circuit also includes a multiplexer device coupled to the clock buffer device configured to multiplex a data input signal and a clock input signal received at respective inputs of the integrated circuit. If the external diode is single-ended, the data input signal is transmitted to the data buffer device, which is then used solely to drive the diode load. If the diode load is differential, the data buffer device receives the data input signal. At the same time, the multiplexer device receives both the data input signal and the clock input signal and selects the data signal to drive the clock buffer device. For a diode load being driven differentially, the outputs of the two buffer devices are merged together externally through the use of a power-combining network, which includes external or off-chip transmission lines, which carry a respective output signal for the data buffer device and the clock buffer device.

17 Claims, 3 Drawing Sheets

METHODS AND CIRCUITS FOR DRIVING LARGE OFF-CHIP LOADS

CROSS-REFERENCE TO RELATED APPLICATIONS

This application claims the benefit of U.S. Provisional Patent Application Ser. No. 60/658,468, filed on Mar. 4, 2005, and entitled "Circuits and Techniques for Driving Large Off-Chip Loads," which is incorporated by reference herein in its entirety.

BACKGROUND OF THE INVENTION

1. Field of the Invention

The present invention relates generally to electronic circuits, and, more particularly, to a method and system to drive large off-chip loads, such as, for example, laser diodes.

2. Art Background

Nowadays, the design of modern very large scale integration ("VLSI") systems is performed with a view towards lowering manufacturing costs. Complementary metal oxide semiconductor ("CMOS") device technology is particularly attractive, since it is relatively low-cost, has high-performance, and enables the integration of greater device functionality on a single integrated circuit chip. Although CMOS technology scales well, some of the system blocks that interface the integrated circuit ("IC") with external devices are difficult to integrate because the necessary output signals levels may not scale as well.

Such high integration of functionality on a single integrated circuit chip is exemplified in a typical 10-gigabit Ethernet chip, which includes an extension attachment unit interface (XAUI), a packet coding sublayer (PCS), a limiting amplifier, a clock and data recovery and demultiplexer module, as well as a 10 Gigabit/second (Gbps) multiplexer module. The 10 Gbps multiplexer module further interfaces with an external buffer that drives the inputs of an external load, such as, for example, a laser diode. The photonic emission of the laser diode is modulated, sending signals down an optical fiber. The voltage swing requirement to modulate these laser diodes may be stringent, requiring the use of a fairly large driver device.

For most applications today, a buffer device, integrated with the IC, interfaces with an off-chip laser driver. The single-ended input impedance is typically a standard value, such as 50 Ohms (50Ω). The output of the off-chip laser driver is designed appropriately for any given application in order to drive a certain diode load. For some applications, the laser diodes may be driven single-ended, with the diode biased appropriately to provide a 50Ω termination. Alternatively, the diodes may be driven differentially. For a differential configuration, the diode may be again biased to provide a 50Ω termination, which is equivalent to a single-ended termination of 25Ω.

Since the prior applications involve a high overall system cost, in part due to the cost of the off-chip driver device, what is needed is an integrated circuit that would eliminate the cost of the off-chip laser driver device by integrating an on-chip driver device capable of directly driving an external diode load. In addition, what is needed is an integrated circuit that would be capable of driving both a single-ended 50Ω load, as well as a differential 50Ω load, equivalent to 25Ω single-ended, thus allowing for greater flexibility, depending on the current application.

SUMMARY OF THE INVENTION

A method and system to drive large off-chip loads, such as, for example, laser diodes are described. The system includes an integrated circuit coupled to an external differential diode load. Alternatively, the external diode load may be driven single-ended. The integrated circuit includes a data buffer device and a clock buffer device. The integrated circuit also includes a multiplexer device coupled to the clock buffer device configured to multiplex a data input signal and a clock input signal received at respective inputs of the integrated circuit. If the external diode is single-ended, the data input signal is transmitted to the data buffer device, which is then used solely to drive the diode load. If the diode load is differential, the data buffer device receives the data input signal. At the same time, the multiplexer device receives both the data input signal and the clock input signal and selects the data signal to drive the clock buffer device. For a diode load being driven differentially, the outputs of the two buffer devices are merged together externally through the use of a power-combining network, which includes external or off-chip transmission lines, which carry a respective output signal for the data buffer device and the clock buffer device.

DETAILED DESCRIPTION

Figure 1:
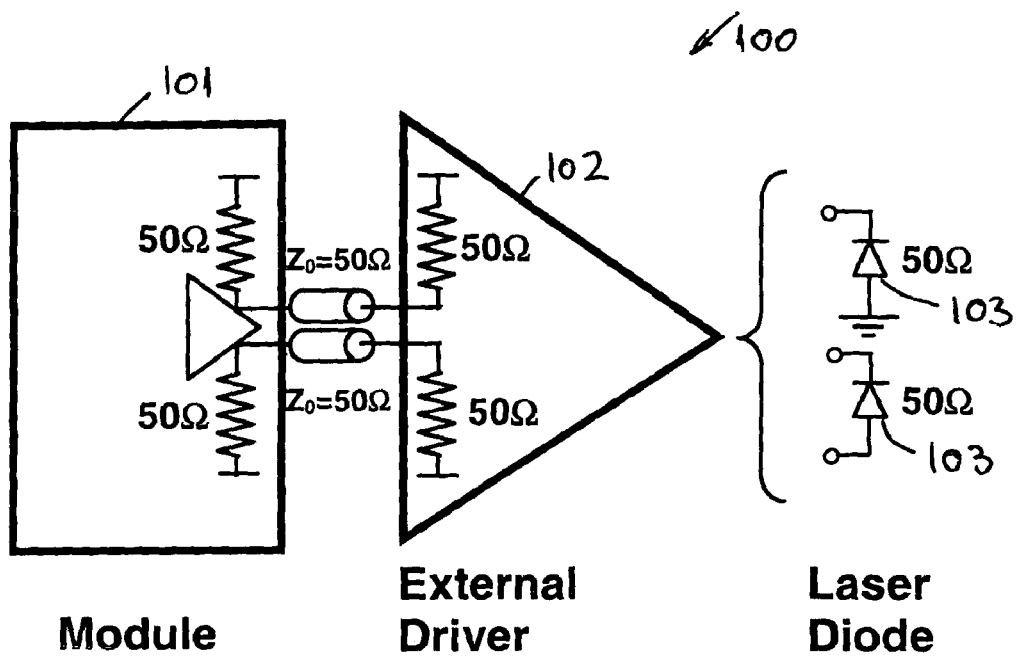
FIG. 1 is a block diagram illustrating a conventional method and system to drive a laser diode from an integrated circuit through the use of an off-chip or external driver circuit.

FIG. 1 is a block diagram illustrating a conventional method and system to drive a laser diode from an integrated circuit through the use of an off-chip or external driver circuit. In the system 100 shown in FIG. 1, the integrated circuit 101, also labeled as "Module," is coupled to an external driver circuit 102, which drives an external laser diode 103. The input termination of the external driver circuit 102 is a predetermined impedance $Z_0$, such as, for example, a single-ended impedance of 50Ω. The laser diode 103 may be driven single-ended and may be biased to provide a 50Ω termination. Alternatively, in some applications, the laser diode 103 may be driven differentially, again being biased to provide a 50Ω termination. It is known that a differential termination of 50Ω is equivalent to a single-ended termination of 25Ω.

The elimination of the off-chip external laser driver device 102 and integration of its functionality into the IC 101 lowers the overall cost of the system 100. However, the two different loading conditions at the diode 103 (i.e., single-ended and differential) make it difficult for a single integrated or on-chip laser driver device to meet the matching requirement at the source end. In addition, once the output impedance of this laser driver device is set to a predetermined value, it cannot be easily changed. The use of additional programmable devices to switch the resistance may result in a significant increase in parasitic capacitance, compromising the bandwidth of the output signal.

Impedance termination of the on-chip laser driver device is particularly important, since the impedance of the laser diode 103 may not be matched to the transmission line. Even if the small-signal resistance of the laser diode 103 may be exactly set to a nominal value of 50Ω, large signals swings may cause this resistance to change significantly. Therefore, if the on-chip driver device is not terminated properly, reflections at the load end may result in significant inter-symbol interference.

Figure 2:
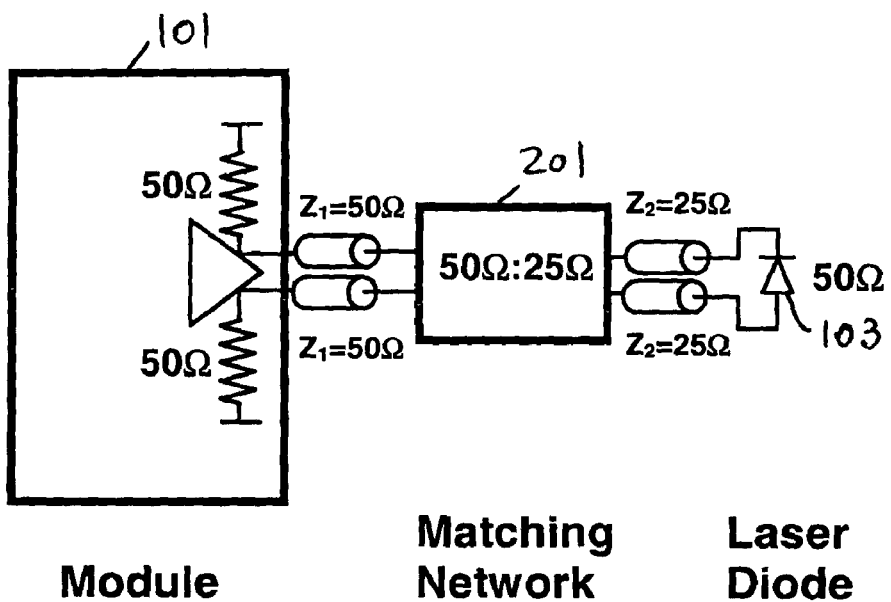
FIG. 2 is a block diagram illustrating a conventional matching network to drive a 50Ω differential diode load.

FIG. 2 is a block diagram illustrating a conventional external matching network to drive a 50Ω differential diode load. In one known approach shown in FIG. 2, the off-chip driver device 102 of FIG. 1 is replaced with an off-chip or external matching network 201 to provide impedance transformation for the applications that require it, such as, for example, if the single-ended driver impedance is terminated to a nominal standard value of 50Ω. However, in this approach, a cost-benefit analysis may indicate that multi-GigaHertz (GHz) broadband, lossless matching networks may be more expensive than the off-chip driver device 102 being eliminated. In addition, the matching networks, such as the matching network 201 shown in FIG. 2, have some non-ideal properties that result in significant performance degradation (e.g., loss, relatively narrow bandwidth, and/or poor reflection coefficients). For example, if substantial loss in the matching network 201 is tolerated, then more power from the driver end is required to compensate for the loss. Hence, the driver size must also increase, resulting in additional parasitic capacitance and lower bandwidth. The increase in driver size may also make the source impedance termination requirement harder to meet.

Figure 3:
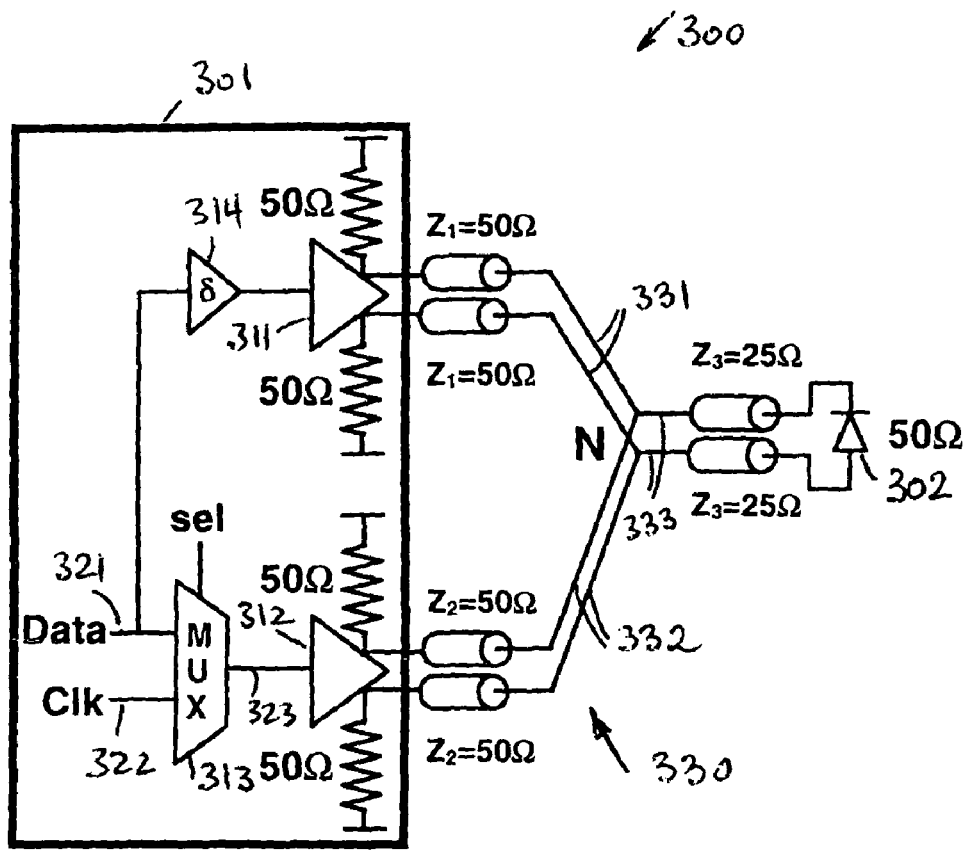
FIG. 3 is a block diagram illustrating a system to drive an off-chip device load using a power-combining network, according to one embodiment of the invention.

FIG. 3 is a block diagram illustrating a system to drive an off-chip device load using a power-combining network, according to one embodiment of the invention. As illustrated in FIG. 3, the system 300 includes an integrated circuit 301 coupled to an external differential diode load 302, biased, for example, to an impedance termination value of 50Ω. Alternatively, the external diode load 302 may be driven single-ended, to an impedance termination value of 50Ω.

In one embodiment, the integrated circuit 301 further includes a driver circuit, which comprises a data buffer device 311 and a clock buffer device 312, each having a single-ended source impedance value of 50Ω, and an Ethernet circuit coupled to and integrated on-chip with said driver circuit. The integrated circuit 301 also includes a multiplexer device 313 coupled to the clock buffer device 312 configured to multiplex a data input signal 321 and a clock input signal 322 received at respective inputs of the integrated circuit 301, as described in detail below.

In one embodiment, if the external diode load 302 is single-ended, the data input signal 321 is transmitted to the data buffer device 311, which subsequently is the sole device that drives the diode load 302. In an alternate embodiment, if the diode load 302 is a differential 50Ω load (25Ω single-ended), the data buffer device 311 receives the data input signal 321. At the same time, the multiplexer device 313 receives both the data input signal 321 and the clock input signal 322 and selects one of the two signals to output a multiplexed signal 323, which is then fed through the clock buffer device 312. For the differential diode load embodiment, the outputs of the two buffer devices 311 and 312 are merged together externally through the use of a power-combining network 330, which includes external or off-chip 50Ω transmission lines, which carry a respective output signal for the data buffer device 311 and the clock buffer device 312, as described in further detail below.

In one embodiment, since the multiplexer device 313 introduces an inherent delay in the system 300, the integrated circuit 301 further includes an additional buffer stage δ 314, prior to the data buffer device 311, which receives the data input signal 321 and permits equalizing the delays and signal swings of the two paths.

In one embodiment, the power-combining network 330 further includes a first transmission line pair 331, coupled to the data buffer device 311 at a first end, and a second transmission line pair 332, coupled to the clock buffer device 312 at a first end. A second end of each of the first and second transmission line pairs 331, 332 is coupled to a third transmission line pair 333 at a first end, the third transmission line pair 333 being coupled to the diode load 302 at a second end.

Figure 4:
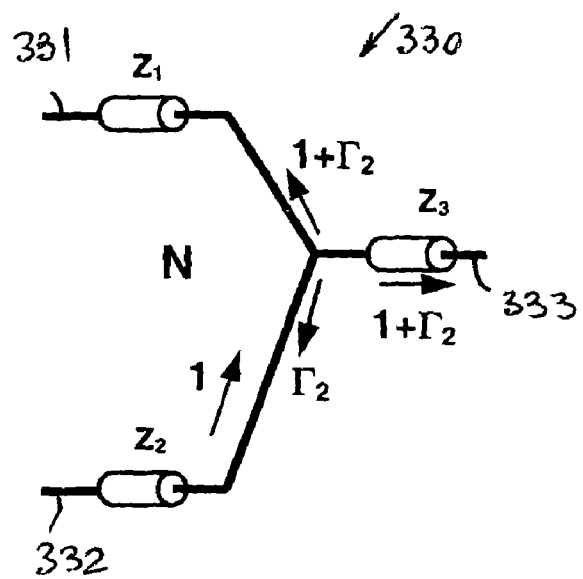
FIG. 4 is a schematic diagram illustrating a merging node of two transmission lines within the power-combining network, according to one embodiment of the invention.

FIG. 4 is a schematic diagram illustrating a merging node of two transmission lines within the power-combining network 330, according to one embodiment of the invention. In the general single-ended embodiment of FIG. 4, two transmission lines 331 and 332 of respective characteristic impedances $Z_1$ and $Z_2$ merge to drive a transmission line 333 of characteristic impedance $Z_3$. Each incoming unit pulse on the $Z_2$ line 332 generates three pulses, one for each line, when incident on the merge node N, as shown in FIG. 4. One pulse, of magnitude $\Gamma_2$, is reflected back to the driver. In addition, distinct and identical pulses of magnitude $1+\Gamma_2$ are launched on lines $Z_1$ 331 and $Z_3$ 333. Similarly, a unit pulse from the $Z_1$ line 331 generates a reflected pulse of magnitude $\Gamma_1$, and launches pulses of magnitude $1+\Gamma_2$, on lines $Z_2$ 332 and $Z_3$ 333.

For no net generated pulse to exist on lines $Z_1$ 331 and $Z_2$ 332, $$1+\Gamma_1+\Gamma_2=0.$$

If $Z_3=Z_1\|Z_2=Z_1Z_2(Z_1+Z_2)^{-1}$, then the condition is satisfied.

For example, $Z_1=Z_2=50\Omega$, $Z_3=Z_1\|Z_2=25\Omega$. On line $Z_3$ 333, there exists a net pulse of magnitude $2+\Gamma_1+\Gamma_2=1$. To observe no spurious reflected pulses, the incident pulses along lines $Z_1$ 331 and $Z_2$ 332 require exact synchronization.

In an alternate embodiment, the $Z_1$ line 331 and the $Z_2$ line 332 are virtually combined into a single line with characteristic impedance $Z_1\|Z_2$. If the respective pulses along these lines move exactly in step, and if the lines have identical lengths, the composite pulse moving along the composite line will arrive at the merge node N and see no difference, since the $Z_3$ line 333 is chosen to be $Z_1\|Z_2$. In this embodiment, the composite pulse continues to propagate along the $Z_3$ line 333, unaffected. This technique may be extended to N incoming lines at the input, merging together to drive a line with characteristic impedance $Z_1\|Z_2\|Z_3\|Z_4\ldots Z_N$.

Figure 5:
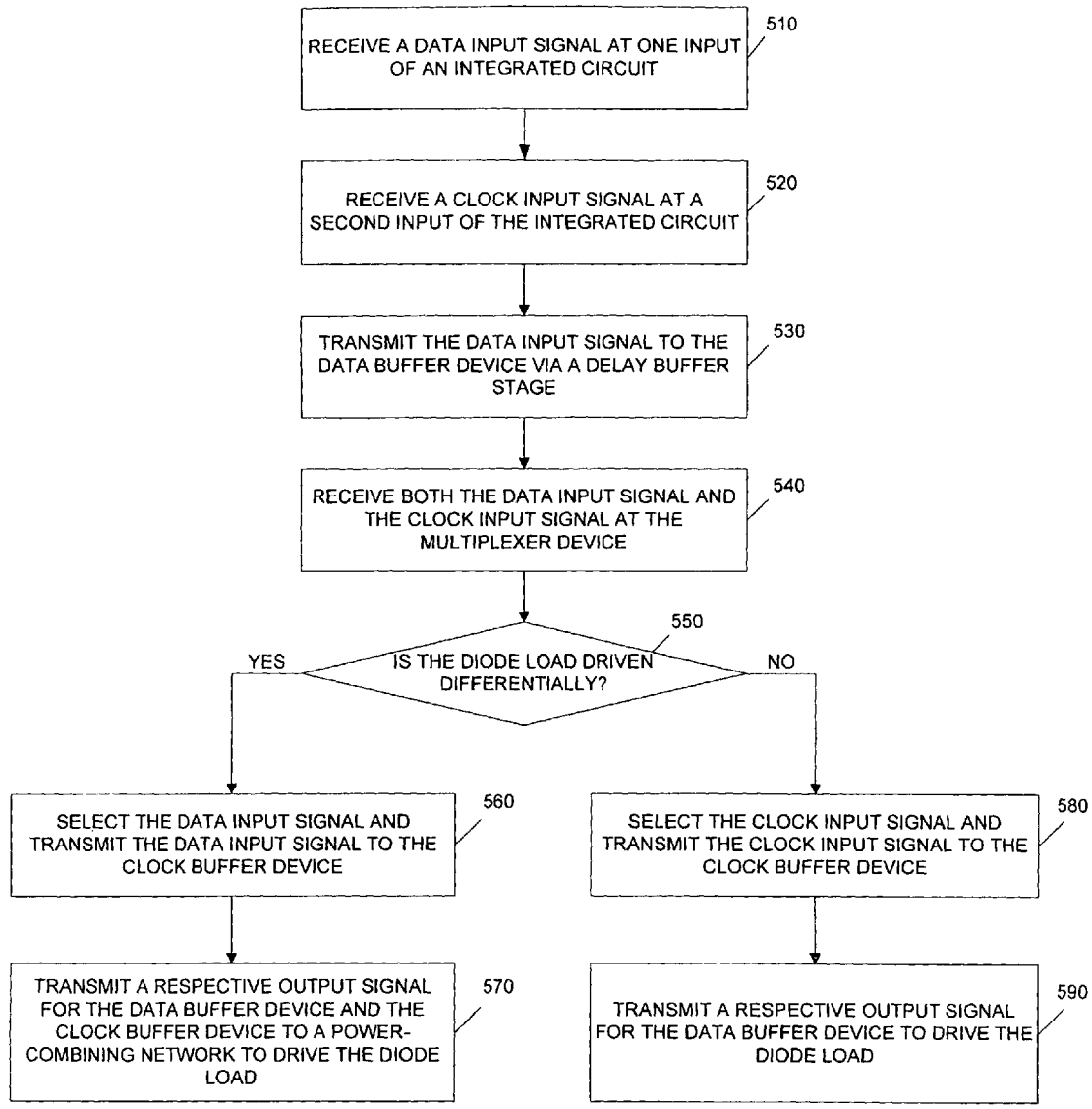
FIG. 5 is a flow diagram illustrating a method to drive an off-chip device load using a power-combining network, according to one embodiment of the invention.

FIG. 5 is a flow diagram illustrating a method to drive an off-chip device load using a power-combining network, according to one embodiment of the invention. As shown in FIG. 5, at processing block 510, a data input signal 321 is received at one input of an integrated circuit 301. At processing block 520, a clock input signal 322 is received at a second input of the integrated circuit 301.

At processing block 530, the data input signal is transmitted to the data buffer device 311 through a delay buffer stage 314. At processing block 540, the data input signal 321 and the clock input signal 322 are received at the input of a multiplexer device 313 coupled to the clock buffer device 312.

At processing block 550, a decision is made whether the diode load 302 is driven differentially or single-ended. If the diode load 302 is driven differentially, then at processing block 560, the data input signal 321 is selected at the multiplexer device 313 and a multiplexed signal 323 is output to the clock buffer device 312. In one embodiment, the multiplexer device 313 receives the data input signal 321 and the clock input signal 322, and outputs the data input signal 321 as a multiplexed signal 323 to the clock buffer device 312.

Next, at processing block 570, a respective output signal for each of the data buffer device 311 and the clock buffer device 312 is transmitted to a power-combining network 330 to drive the diode load 302.

If, however, the diode load 302 is not driven differentially, at processing block 580, the clock input signal 322 is selected at the multiplexer device 313 and a multiplexed signal 323 is output to the clock buffer device 312. In one embodiment, the multiplexer device 313 receives the data input signal 321 and the clock input signal 322, and outputs the clock input signal 321 as a multiplexed signal 323 to the clock buffer device 312.

Finally, at processing block 590, an output signal for the data buffer device 311 is transmitted to drive the diode load 302.

Although the present invention has been described in terms of specific exemplary embodiments, it will be appreciated that various modifications and alterations might be made by those skilled in the art without departing from the spirit and scope of the invention.

What is claimed is:

1. A system for driving a device load, the system comprising:
   an integrated circuit comprising:
      a first input configured for receiving a data signal;
      a second input configured for receiving a clock signal;
      a multiplexer configured for:
         receiving the data signal and the clock signal; and
         for a device load driven differentially, outputting the data signal as a multiplexed signal to a clock buffer device;
      the clock buffer device configured for receiving the multiplexed signal and outputting the multiplexed signal to a power network; and
      a data buffer device configured for:
         receiving the data signal, wherein the received data signal is transmitted from the first input of the integrated circuit to the data buffer device without passing through the multiplexer; and
         outputting the received data signal to the power network; and
   the power network to couple said integrated circuit to said device load, the power network configured for receiving the data signal from the data buffer device and receiving the multiplexed signal from the clock buffer device for driving the device load, the device load being coupled to the power network at both ends of the device load.

2. The system according to claim 1, wherein said device load is a laser diode.

3. The system according to claim 1, wherein the power network comprises a first transmission line pair, coupled to said data buffer device at a first end, and a second transmission line pair, coupled to said clock buffer device at a first end, a second end of said first and second transmission line pairs being coupled to a third transmission line pair at a first end, and said third transmission line pair being coupled to said device load at a second end.

4. The system according to claim 3, wherein each line of said first transmission line pair comprises a characteristic impedance of $Z_1$, each line of said second transmission line pair comprises a characteristic impedance of $Z_2$, and each line of said third transmission line pair comprises a characteristic impedance of $Z_3$, wherein $Z_1=Z_2$ and $\frac{1}{2}(Z_1)=Z_3$.

5. The system according to claim 1, wherein the integrated circuit further comprises a stage prior to the data buffer device to equalize delays and signal swings of respective outputs of said data buffer device and said clock buffer device.

6. The system according to claim 1, wherein the integrated circuit comprises a 10-gigabit Ethernet integrated circuit.

7. The system of claim 1, wherein the device load comprises a plurality of respective impedance termination values.

8. The system of claim 1, wherein the outputs of the data buffer device and the clock buffer device are merged together through the power network which carries a respective output signal for the data buffer device and the clock buffer device.

9. The system of claim 1, wherein the multiplexer is further configured for:
   for a device load not driven differentially, outputting the clock signal as the multiplexed signal to the clock buffer device.

10. A method for driving a device load, the method comprising:
    providing an integrated circuit comprising:
       a first input configured for receiving a data signal;
       a second input configured for receiving a clock signal;
       a multiplexer configured for:
          receiving the data signal and the clock signal; and
          for a device load driven differentially, outputting the data signal as a multiplexed signal to a clock buffer device;
       the clock buffer device configured for receiving the multiplexed signal and outputting the multiplexed signal to a power network; and
       a data buffer device configured for:
          receiving the data signal, wherein the received data signal is transmitted from the first input of the integrated circuit to the data buffer device without passing through the multiplexer; and
          outputting the received data signal to the power network; and
    providing the power network to couple said integrated circuit to said device load, the power network configured for receiving the data signal from the data buffer device and receiving the multiplexed signal from the clock buffer device for driving the device load, the device load being coupled to the power network at both ends of the device load.

11. The method according to claim 10, wherein said device load is a laser diode.

12. The method according to claim 10, wherein the power network comprises a first transmission line pair, coupled to said data buffer device at a first end, and a second transmission line pair, coupled to said clock buffer device at a first end, a second end of said first and second transmission line pairs being coupled to a third transmission line pair at a first end, and said third transmission line pair being coupled to said device load at a second end.

13. The method according to claim 12, wherein each line of said first transmission line pair comprises a characteristic impedance of $Z_1$, each line of said second transmission line pair comprises a characteristic impedance of $Z_2$, and each line of said third transmission line pair comprises a characteristic impedance of $Z_3$, wherein $Z_1=Z_2$ and $\frac{1}{2}(Z_1)=Z_3$.

14. The method according to claim 10, wherein the integrated circuit further comprises a stage prior to the data buffer device to equalize delays and signal swings of respective outputs of said data buffer device and said clock buffer device.

15. The method of claim 10, wherein the device load comprises a plurality of respective impedance termination values.

16. The method of claim 10, wherein the outputs of the data buffer device and the clock buffer device are merged together through the power network which carries a respective output signal for the data buffer device and the clock buffer device.

17. The method of claim 10, wherein the multiplexer is further configured for:
    for a device load not driven differentially, outputting the clock signal as the multiplexed signal to the clock buffer device.

* * * * *